United States Patent [19]

Callerio et al.

[11] Patent Number: 5,029,635

[45] Date of Patent: Jul. 9, 1991

[54] DEVICE FOR COOLING REGIONS WITH LIMITED THERMAL EXCHANGE SURFACE, IN PARTICULAR FOR ELECTRONIC COMPONENTS

[75] Inventors: Antonio Callerio; Vincenzo Callerio, both of Milan, Italy

[73] Assignee: F.I.M.A.C. Fabbrica Italiana Macchine Aria Compressa S.p.A., Senago, Italy

[21] Appl. No.: 362,792

[22] Filed: Jun. 7, 1989

[30] Foreign Application Priority Data

Jun. 15, 1988 [IT] Italy ............................... 20975 A/88

[51] Int. Cl.⁵ ..................... H01L 23/473; F25B 39/02
[52] U.S. Cl. .................................. 165/80.4; 165/911;
62/525; 62/528; 62/259.2; 361/385
[58] Field of Search ....................... 62/527, 528, 259.2,
62/511, 525; 165/903, 911, 80.4; 361/385

[56] References Cited

U.S. PATENT DOCUMENTS

| | | | |
|---|---|---|---|
| 2,295,087 | 9/1942 | Kleucher et al. ..................... | 62/527 |
| 2,393,854 | 1/1946 | Carpenter ............................. | 62/511 |
| 2,698,162 | 12/1954 | Riesgo ................................. | 165/903 |
| 3,006,157 | 10/1961 | Haettinger et al. ................. | 62/259.2 |
| 3,324,674 | 6/1967 | Finnegan .............................. | 62/223 |

Primary Examiner—Albert W. Davis, Jr.
Attorney, Agent, or Firm—Guido Modiano; Albert Josif

[57] ABSTRACT

This device for cooling regions with limited thermal exchange surface, in particular for electronic components, comprises a body made of thermally conducting material which internally defines a duct for the passage of a refrigerating fluid and has a portion of its surface associable with a region to be refrigerated; the passage duct has, for at least a portion of its extension, a circular cross section, and at this portion there is an injection nozzle which is fed with pressurized refrigerating fluid so as to cause expansion of the refrigerating fluid in the passage duct. The injection nozzle is arranged in the body with a delivery direction having a component which is tangent to the circumference of the cross section of the passage duct to achieve a vorticose motion of the expanding refrigerating fluid about the axis of the passage duct, producing, by centrifugal force, a separation between liquid, which adheres to the wall, and vapor, which flows at the center of the passage duct, thus enhancing the thermal exchange between the fluid and the cooling surface.

9 Claims, 1 Drawing Sheet

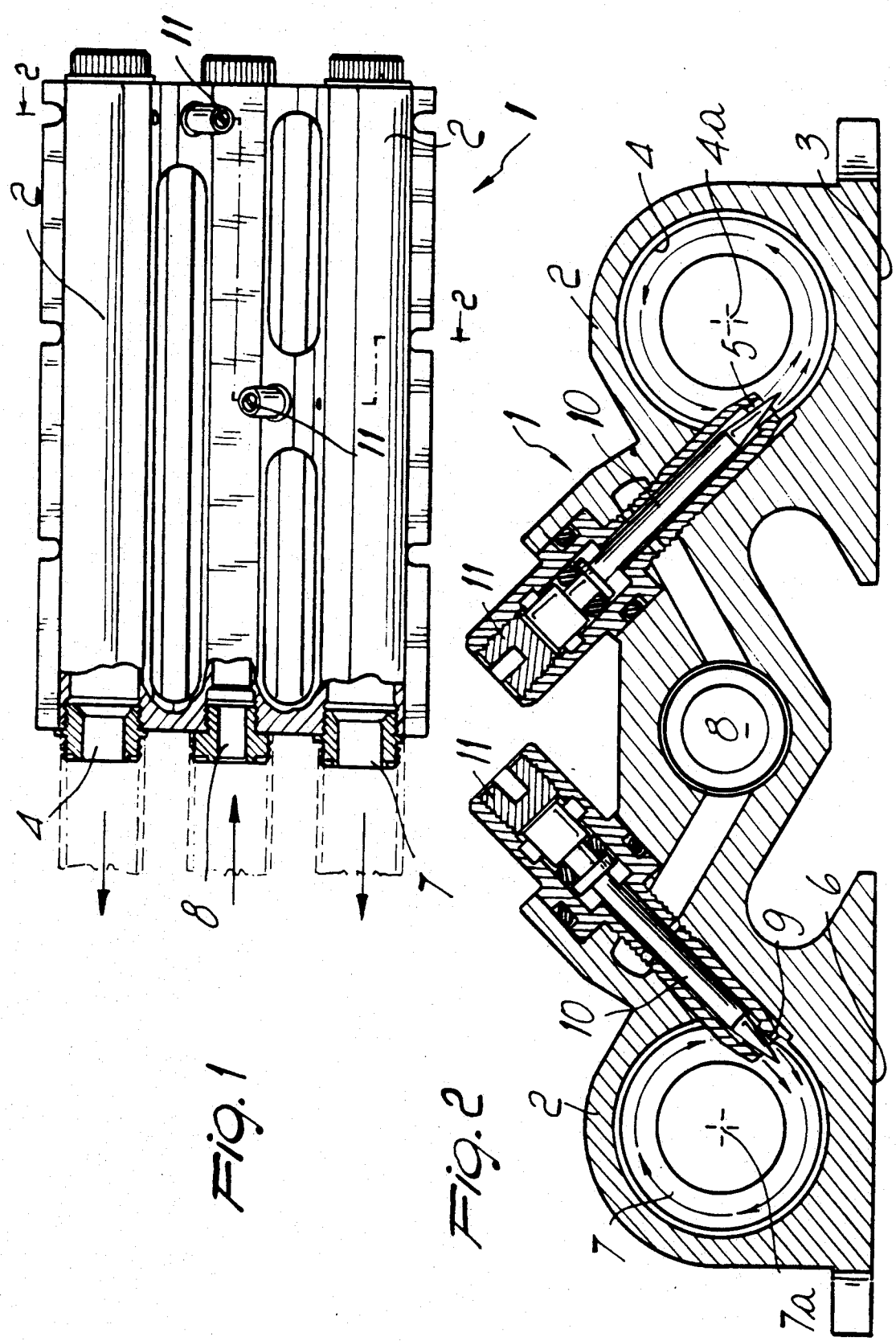

DEVICE FOR COOLING REGIONS WITH LIMITED THERMAL EXCHANGE SURFACE, IN PARTICULAR FOR ELECTRONIC COMPONENTS

BACKGROUND OF THE INVENTION

The present invention relates to a device for cooling regions with limited thermal exchange surface, in particular for electronic components.

As is known, most of the electronic components currently used in control circuits have an extremely low efficiency, usually approximately 10%, and therefore most of the electric power supply is converted into heat. On the other hand, in order to ensure the correct operation of these components, they must be kept within a rather narrow temperature range. In view of the fact that the thermal exchange surface available to remove the excess heat from said electronic components is rather small, usually a few square centimeters, the problem of eliminating the heat produced by the operation of electronic components is particularly felt.

A plate with a substantially planar face, to be coupled to the region of the electronic components to be cooled, is currently used to eliminate the excess heat from components of this kind; a plurality of channels is defined in the plate and extends from a single duct through most of the surface to be coupled to the region which should be cooled. Said duct is fed with a refrigerating fluid, usually freon, which is compressed and refrigerated through a conventional thermodynamic cycle. An injection nozzle is arranged at the input of said duct and causes the expansion, or vaporization, of the refrigerating fluid, which successively flows through the branched channels and cools the plate, thus removing heat from the region to be refrigerated.

Due to the advancement of technology, which has led to a rapid decrease in the dimensions of electronic components, such known devices are very often insufficient to ensure the operation of said components within their optimum temperature range, with consequent reduction in the reliability and durability of said components.

Due to the branched structure of the channels inside the plate, when the plate dimensions are reduced, consequently reducing the dimensions of the channels, the amount of removable heat is in fact considerably reduced.

SUMMARY OF THE INVENTION

The aim of the present invention is to solve the above described problems by providing a device which ensures an effective cooling of regions with a limited thermal exchange surface and is therefore particularly suitable for cooling small-size electronic components.

Within this aim, an object of the invention is to provide a device which is simple to manufacture and has a modest cost.

This aim, this object and others which will become apparent hereinafter are achieved by a device for cooling regions with limited thermal exchange surface, as defined in the appended claim 1.

BRIEF DESCRIPTION OF THE DRAWINGS

The characteristics and advantages of the invention will become apparent from the description of a preferred but not exclusive embodiment of the device according to the invention, illustrated only by way of non-limitative example in the accompanying drawings, wherein:

FIG. 1 is a top plan view of the device according to the invention; and

FIG. 2 is an enlarged section of FIG. 1 taken along the line II—II.

DESCRIPTION OF THE PREFERRED

With reference to the above figures, the device according to the invention, generally by the reference numeral 1, comprises a body 2 of thermally conducting material which has a portion of its surface which can be fixed onto a region to be refrigerated. Inside the body 2, proximate to the region to be refrigerated, a duct 4 is defined for the passage of a ting fluid; said duct conveniently has a circular cross section. An injection nozzle 5 is arranged along the passage duct 4 and is fed with the refrigerating fluid to be fed into the passage duct 4; said injection nozzle is arranged in the body 2 with a delivery direction having at least a component which is tangent to the perimetric region of the cross section of the passage duct 4 so as to obtain a vorticose motion of the expanding refrigerating fluid about the axis 4a of the passage duct, facilitating the contact between the liquid and the wall of the duct by centrifugal force.

More particularly, in the illustrated embodiment, the body 2 has two portions 3 and 6 of its surface preset to rest against regions to be refrigerated and two passage ducts 4 and 7, each passage duct being defined proximate to one respective of said portions. The 3 and 6 are planar, and the passage ducts 4 and 7 are arranged with their axes 4a and 7a parallel to one another and to the plane defined by the portions 3 and 6.

A feed duct 8 is provided between the passage ducts 4 and 7 and feeds the pressurized refrigerating fluid to the injection nozzles 5 and 9 arranged respectively tangent to the passage duct 4 and the passage duct 7.

Each injection nozzle 5, 9 has a neddle nozzle shutter means 10 which can be moved, by means of a screw 11, along its axis to conveniently vary the cross sectional area of the delivery end section of the nozzle. Such a variation of the cross sectional area of the delivery end is advantageously obtained due to the formation of a tapered needle-like extremity of the needle nozzle shutter means which protrude in an adjustably movable manner through the cross section of the delivery end of the injection nozzle.

The operation of the device according to the invention is evident from what has been described and illustrated, and in particular it is evident that the device according to the invention can constitute the evaporator unit of a refrigerating cycle by connecting the feed duct 8 to the delivery of a compressor, through an exchanger which refrigerates the compressed fluid, and by connecting the passage ducts 4 and 7 to the compressor intake duct.

The injection of the refrigerating fluid in the passage duct 4 causes a partial evaporation and, as an effect of the vorticose motion, the liquid separates from the vapor by centrifugal force; in detail the liquid adheres to the wall of the passage duct 4, while the vapor flows towards the axis 4a, achieving an excellent thermal exchange between the fluid and the cooling surface. The liquid subsequently evaporates and in turn flows towards the axis 4a of the duct 4. Furthermore, as can be seen in FIGS. 1 and 2, the injection nozzles 5 and 9 are arranged at different relative positions along the axis of the feed duct 8, and in fact, such injection nozzles can be understood as being advantageously placed at appropriate positions along the feed duct axis, depending on the particular heat, transfer requirements. Thus, an injection nozzle arranged at a given point relative to the feed duct axis will supply an excellent heat transfer at that particular point.

In practice it has been observed that the device according to the invention fully achieves the intended aim, since by virtue of its ability to remove large amounts of heat even with extremely reduced available thermal exchange surfaces it ensures that an optimum operating temperature is maintained for small electronic components.

Though the device according to the invention has been conceived particularly to ensure the correct operation of small-size electronic components, it may however be used more generally for any use which requires the rapid elimination of large amounts of heat.

The device thus conceived is susceptible to numerous modifications and variations, all of which are within the scope of the inventive concept; all the details may furthermore be replaced with technically equivalent elements.

In practice the materials employed, so long as compatible with the specific use, as well as the dimensions, may be any according to the requirements and to the state of the art.

We claim:

1. A device for cooling regions with limited thermal exchange surface, comprising a body made of thermally conducting material, which internally defines at least one passage duct for a refrigerating fluid and has at least one cooling surface, said passage duct defining an axis and having at least one portion with circular cross section defining a wall, said body accommodating at least one expansion injection nozzle fed with pressurized refrigerating fluid, said injection nozzle opening at said portion of said passage duct and defining a delivery direction having a component which is tangent to said wall of said portion of said passage duct to cause a vorticose motion of said refrigerating fluid about said axis of said passage duct, producing by centrifugal force a separation of said refrigerating fluid between a liquid phase, which adheres to said wall of said passage duct, and a vapor phase, which flows centrally to said passage duct, said cooling surface of said body being substantially planar, said axis of said passage duct being arranged substantially parallel to said cooling portion.

2. A device according to claim 1, wherein said injection nozzle has an adjustable cross section for refrigerating fluid delivery.

3. A device according to claim 1, further comprising a feed duct being fed with pressurized refrigerating fluid and being accommodated within said body, said at least one passage duct comprising two parallel passage ducts, said at least one expansion injection nozzle comprising at least two expansion injection nozzles, each one of said at least two expansion injection nozzles connecting said feed duct with one of said two parallel passage ducts, said at least one cooling surface comprising two cooling surfaces, each one of said two parallel passage ducts extending close to a respective one of said two cooling surfaces.

4. A device for cooling regions with limited thermal exchange surface comprising a body being made of thermally conducting material and having at least one cooling surface, said body internally defining at least one passage duct and a feed duct being fed with pressurized refrigerating fluid, said at least one passage duct defining an axis and having at least one portion with circular cross section defining a wall being arranged in heat transfer proximity with said at least one cooling surface, said body accommodating at least one expansion injection nozzle being fed at an inlet thereof with pressurized refrigerating fluid from said feed duct and opening at said at least one portion of said at least one passage duct and defining a delivery direction having a component which is tangent to said wall of said at least one portion of said at least one passage duct to cause a vorticose motion of said refrigerating fluid about said axis of said at least one passage duct, producing by centrifugal force a separation of said refrigerating fluid between a liquid phase, which adheres to said wall of said at least one passage duct, and a vapor phase, which flows centrally to said at least one passage duct, said at least one expansion injection nozzle being arranged along said axis of said at least one passage duct according to heat transfer requirements at said at least one cooling surface.

5. Device according to claim 4, further comprising a needle nozzle shutter means being slidably accommodated inside said at least one expansion injection nozzle and having a tapered needle-like extremity in adjustable substantially perpendicular arrangement with a delivery cross sectional end of said at least one expansion injection nozzle, whereby a cross sectional area of said delivery cross sectional end is adjustable to a required value depending upon a specific heat transfer requirement of a region of said at least one cooling surface arranged proximate to said at least one portion of said at least one passage duct.

6. Device according to claim 4, wherein said at least one cooling surface of said body is substantially planar, said axis of said at least one passage duct being arranged substantially parallel to said at least one cooling surface.

7. Device according to claim 4, wherein said at least one passage duct comprises two parallel passage ducts, said at least one expansion injection nozzle comprising at least two expansion injection nozzles, each one of said at least two expansion injection nozzles connecting said feed duct with one of said two parallel passage ducts, said at least one cooling surface comprising two cooling surfaces, each one of said two parallel passage ducts extending close to a respective one of said two cooling surfaces.

8. A device for cooling regions with limited thermal exchange surface comprising a body being made of thermally conducting material and having at least one cooling surface, said body internally defining at least one passage duct for a refrigerating fluid, said passage duct defining an axis and having at least one portion with circular cross section defining a wall being arranged in heat transfer proximity with said cooling surface, said body accommodating at least one expansion injection nozzle fed with pressurized refrigerating fluid, said expansion injection nozzle opening at said portion of said passage duct and defining a delivery direction having a component which is tangent to said wall of said portion of said passage duct to cause a vorticose motion of said refrigerating fluid about said axis of said passage duct, producing by centrifugal force a separation of said refrigerating fluid between a liquid phase, which adheres to said wall of said passage duct, and a vapor phase, which flows centrally to said passage duct, said device further comprising a needle nozzle shutter means being slidably accommodated inside said expansion injection nozzle and having a tapered needle-like extremity in adjustable substantially perpendicular arrangement with a delivery cross sectional end of said expansion injection nozzle, said cooling surface of said body being substantially planar, said axis of said passage duct being arranged substantially parallel to said cooling surface, whereby a cross sectional area of said delivery cross sectional end is adjustable to a required value depending upon a specific heat transfer requirement of a region of said cooling surface arranged proximate to said portion of said passage duct.

9. Device according to claim 8, further comprising a feed duct being fed with pressurized refrigerating fluid and being accommodated within said body, said at least one passage duct comprising two parallel passage ducts, said at least one expansion injection nozzle comprising at least two expansion injection nozzles, each one of said at least two expansion injection nozzles connecting said feed duct with one of said two parallel passage ducts, said at least one cooling surface comprising two cooling surfaces, each one of said two parallel passage ducts extending close to a respective one of said two cooling surfaces.

* * * * *